United States Patent
Tarsa et al.

(10) Patent No.: US 9,263,636 B2
(45) Date of Patent: Feb. 16, 2016

(54) LIGHT-EMITTING DIODE (LED) FOR ACHIEVING AN ASYMMETRIC LIGHT OUTPUT

(75) Inventors: Eric J. Tarsa, Goleta, CA (US);
Theodore D. Lowes, Lompoc, CA (US);
Bernd P. Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/100,786

(22) Filed: May 4, 2011

(65) Prior Publication Data

US 2012/0280261 A1    Nov. 8, 2012

(51) Int. Cl.
*H01L 33/20* (2010.01)
*H01L 23/00* (2006.01)

(52) U.S. Cl.
CPC ............... *H01L 33/20* (2013.01); *H01L 24/32* (2013.01); *H01L 2924/12041* (2013.01)

(58) Field of Classification Search
CPC ........................................................ H01L 33/20
USPC ............................................................ 257/95
See application file for complete search history.

(56) References Cited

U.S. PATENT DOCUMENTS

| | | | |
|---|---|---|---|
| 4,542,397 A * | 9/1985 | Biegelsen et al. | 257/723 |
| 5,990,497 A | 11/1999 | Kamakura et al. | 257/94 |
| 6,784,460 B2 * | 8/2004 | Ng et al. | 257/95 |
| 7,419,912 B2 | 9/2008 | Donofrio | 438/694 |
| 7,525,126 B2 * | 4/2009 | Leatherdale et al. | 257/98 |
| 2002/0187571 A1 * | 12/2002 | Collins et al. | 438/29 |
| 2003/0222259 A1 * | 12/2003 | Senda et al. | 257/13 |
| 2005/0023545 A1 * | 2/2005 | Camras et al. | 257/98 |
| 2007/0258246 A1 | 11/2007 | Leatherdale et al. | 362/326 |
| 2007/0284604 A1 * | 12/2007 | Slater et al. | 257/98 |
| 2009/0008654 A1 | 1/2009 | Nagai | |
| 2009/0316384 A1 | 12/2009 | Kanayama et al. | |

FOREIGN PATENT DOCUMENTS

| | | | | |
|---|---|---|---|---|
| EP | 1 569 283 A1 | | 8/2005 | ............... H01L 33/00 |
| JP | 8264839 | | 10/1996 | ............... H01L 33/54 |
| JP | 2009295611 A | | 12/2009 | |
| WO | WO 2008/084882 A1 | | 7/2008 | ............... F21S 8/10 |
| WO | WO/2011/007816 | * | 1/2011 | ............... H01L 33/32 |

OTHER PUBLICATIONS

Huang et al., "Improved Light Extraction of Nitride-Based Flip-Chip Light-Emitting Diodes Via Sapphire Shaping and Texturing," Photonics Technology Letters, IEEE, vol. 18, No. 24, pp. 2623-2625, Dec. 15, 2006; doi: 10.1109/LPT.2006.886823.*
International Search Report and Written Opinion for PCT/US2012/034622; Date of Mailing: Aug. 6, 2012; 11 pages.
Japanese Office Action (translated) dated Dec. 22, 2014 for Patent Application No. 2014-509306, pp. 1-4.

* cited by examiner

*Primary Examiner* — Peniel M Gumedzoe
*Assistant Examiner* — Christopher Johnson
(74) *Attorney, Agent, or Firm* — Brinks Gilson & Lione

(57) ABSTRACT

A light emitting diode (LED) for achieving an asymmetric light output includes a multilayered structure comprising a p-n junction, where at least one layer of the multilayered structure comprises a surface configured to provide a peak emission in a direction away from a normal to a mounting surface, the surface being a top or bottom surface of the layer.

17 Claims, 11 Drawing Sheets

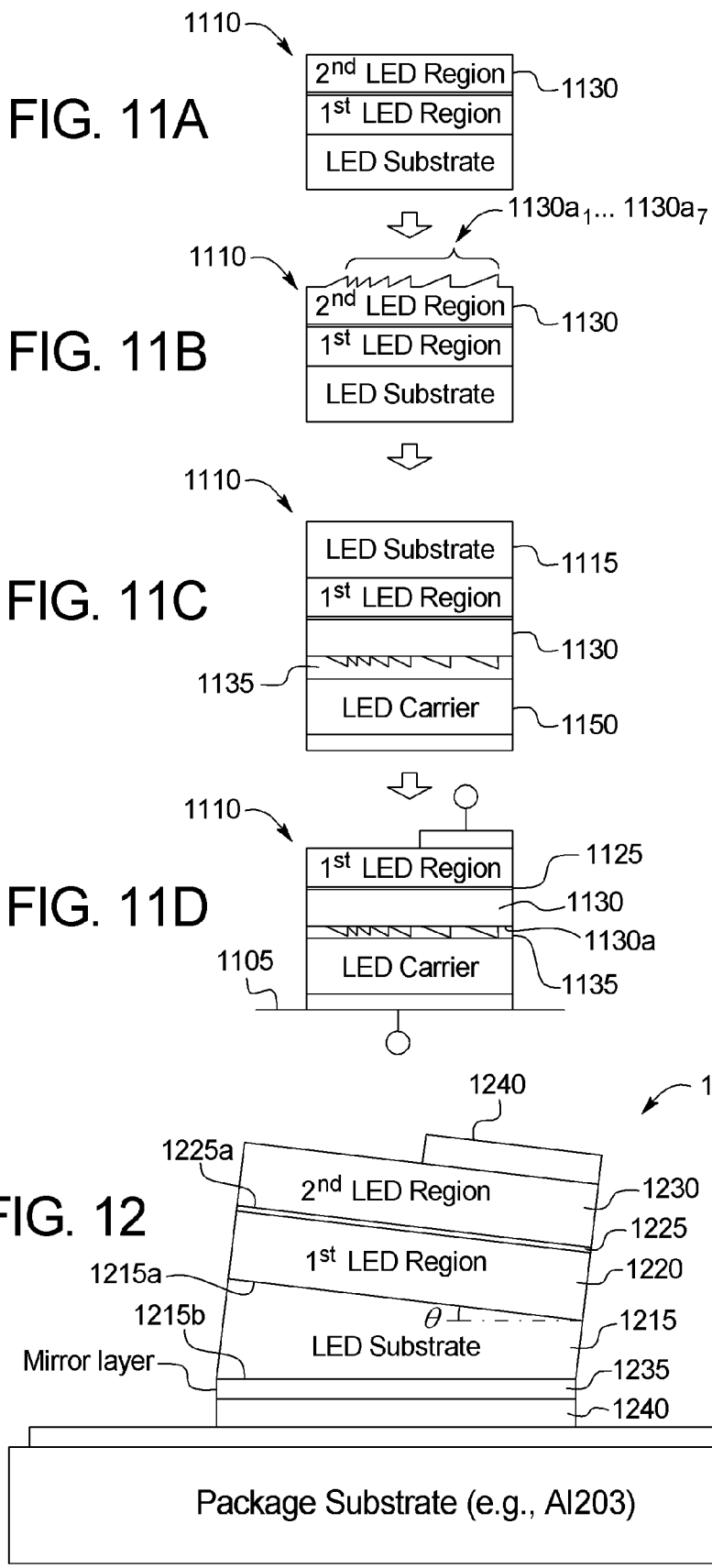

LIGHT-EMITTING DIODE (LED) FOR ACHIEVING AN ASYMMETRIC LIGHT OUTPUT

TECHNICAL FIELD

The present disclosure is directed generally to light emitting diodes (LEDs) and more particularly to LED chips that can produce a desired light emission profile.

BACKGROUND

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more have resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other lights sources and can consume less power. For these and other reasons, LEDs are becoming more popular and are being used in applications that have traditionally been the realm of incandescent, fluorescent, halogen and other emitters.

LEDs are also being used in displays, both big and small. Large screen LED based displays (often referred to as giant screens) are becoming more common in many indoor and outdoor locations, such as at sporting events, race tracks, concerts and in large public areas, such as Times Square in New York City. Many of these displays or screens can be as large as 60 feet tall and 60 feet wide. These screens can include thousands of "pixels" or "pixel modules," each of which may contain a plurality of LEDs. The pixel modules can use high efficiency and high brightness LEDs that allow the displays to be visible from relatively far away, even in the daytime when viewed in sunlight. The pixel modules can have as few as three LEDs (one red, one green, and one blue) that allow the pixel to emit many different colors of light from combinations of red, green and/or blue light. In the largest jumbo screens, each pixel module can have dozens of LEDs. The pixel modules are arranged in a rectangular grid. For example, a grid can be 640 modules wide and 480 modules high, with the end size of the screen being dependent upon the actual size of the pixel modules.

Conventional LED based displays are controlled by a computer system that accepts an incoming signal (e.g., a television signal) and, based on the particular color needed at the pixel module to form the overall display image, the computer system determines which LED in each of the pixel modules is to emit light and how brightly. A power system can also be included that provides power to each of the pixel modules; the power to each of the LEDs may be modulated so that each LED emits at the desired brightness. Conductors are provided to apply the appropriate power signal to each of the LEDs in the pixel modules.

Present technology utilizes optics and geometries that maximize light extraction from the LED to obtain uniform emission profiles. This usually entails a hemispherical lens coupled to a light emitting element where the optical centers of the lens and the emitting surface are perfectly aligned, and the peak light emission is along the optical axis. Such a configuration may not be advantageous for all situations, however, such as when the LED display is mounted above the viewer's eye level. In this case, much of the light emitted by the display may not be seen by the viewer and is thus wasted.

One way to reduce the amount of light that is wasted is by mounting the display at an angle to better match the viewer's line of sight, but this can require complex and expensive mounting hardware that is difficult to use, particularly for very large displays mounted at high elevations. Efforts have also been made to control the light emission from LED packages by modifying the shape of the encapsulant or lens, but this may require special, costly lens tooling and modified lens fabrication processes. Some systems may utilize secondary optics to alter beam profiles or redirect light patterns to different angles; however, the secondary optics may incur significant losses on the order of 10-12% and add cost to the display system.

BRIEF SUMMARY

Described herein is light emitting diode with an intrinsically asymmetric light emission profile.

According to a first embodiment, the LED comprises a multilayered structure including a p-n junction, where at least one layer of the multilayered structure comprises a surface configured to provide a peak emission in a direction away from a normal to a mounting surface, the surface being a top or bottom surface of the layer.

According to a second embodiment, the LED comprises a multilayered structure including a p-n junction, where at least one layer of the multilayered structure comprises a surface configured to provide a peak emission in a direction away from a normal to a mounting surface, the surface being a top or bottom surface of the layer, and the layer having a nonuniform thickness.

According to a third embodiment, the LED comprises a multilayered structure including a light emitting layer comprising a p-n junction and a mirror layer comprising an optically reflective material, where the mirror layer is disposed between the light emitting layer and a mounting surface, and where at least one of the active light emitting layer and the mirror layer is nonparallel to the mounting surface.

BRIEF DESCRIPTION OF THE DRAWINGS

FIGS. 7A and 7B top and side view schematics of a portion of an LED chip having a faceted top surface;

FIGS. 11A-11D depicts a method of making an LED chip including a configured internal surface;

FIG. 12 is a cross-sectional schematic of an exemplary LED chip including a wedge-shaped growth substrate;

DETAILED DESCRIPTION

Figure 1A:
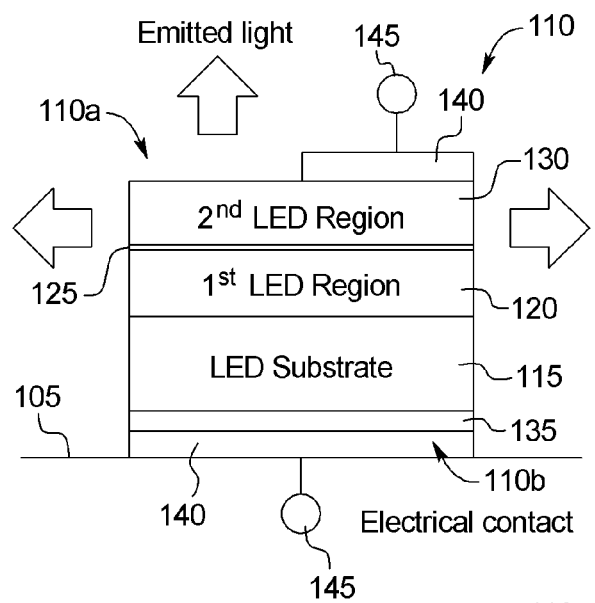
FIGS. 1A and 1B are cross-sectional schematics of conventional LED chips mounted substrate side down.

The present disclosure is directed to light emitting diodes ("LEDs" or "LED chips") configured to provide an asymmetric light emission profile in which the peak emission is directed away from a normal to the underlying mounting surface. By controlling the orientation and/or structure of one or more layers of the LED chips, a desired asymmetric beam profile may be obtained without the need for secondary optics.

For example, and as discussed in greater detail below, an asymmetric beam output profile may be obtained by effectively tilting the active light emitting region and/or the mirror layer relative to the mounting surface and/or by optically guiding the light emitted by the active region prior to its exit from the LED chip. By making one or more of the modifications described herein, an LED chip with an intrinsically asymmetric emission profile may be fabricated and mounted in a conventional package (e.g., planar submount, substrate, or reflector cup) with minimal or no modification of the package design. Such LED components may be used alone or in combination with other components to form a display that has a desirable set of emission characteristics. Examples of lighting applications that may benefit from intrinsically asymmetric emitters include outdoor displays, street lighting, and automotive lighting (e.g., headlights).

Exemplary LED chips for achieving an asymmetric light output profile are shown in FIGS. 4 to 16. In each embodiment, the LED chip includes a multilayered structure comprising a p-n junction, where at least one layer of the multilayered structure comprises a surface configured to provide a peak emission in a direction away from a normal to a mounting substrate, where the surface is a top or bottom surface of the layer. The layer may have a nonuniform thickness. Before proceeding with a description of the various embodiments, some definitions and explanations are provided, and the layer structure of typical LEDs is described and shown schematically in FIGS. 1A to 3C.

As used in the present disclosure, a "normal to a mounting surface" is defined as a line extending from the mounting surface in a direction perpendicular to the plane of the mounting surface. The mounting surface may be a surface of a submount, reflector cup, package substrate, lead frame, or other substrate.

The peak emission of an LED chip is the maximum intensity of light emitted from the chip. An LED chip having a peak emission directed away from the normal to the mounting surface may have a maximum intensity in any direction that is not perpendicular to the plane of the mounting surface.

It is understood that when an element such as a layer, region, or substrate is referred to as being "on" another element, it can be directly on the other element or intervening elements may also be present. Furthermore, relative terms such as "inner," "outer," "upper," "above," "over," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, of manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
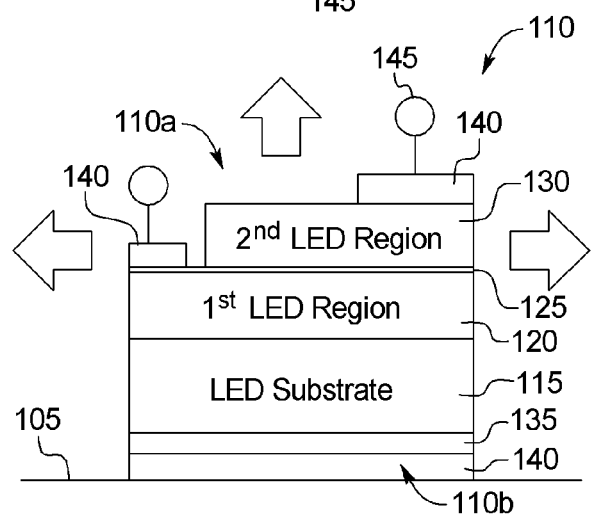

Referring now to FIGS. 1A and 1B, a typical LED or LED chip 110 includes an insulating, semiconducting or conducting substrate 115 such as $Al_2O_3$ or SiC on which n- and p-type epitaxial layers 120,130, which may be referred to as first and second LED regions, are grown. The epitaxial layers 120,130 include an active region 125 having a p-n junction that emits light when energized. The epitaxial layers may be nitride layers, such as GaN, AlGaN or AlN, or they may be based on another III-V material system (e.g., GaAs, GaP, AlAs, etc.) or silicon (e.g., SiC).

In FIGS. 1A and 1B, the LED chip 110 is mounted substrate side down on a mounting surface 105. Light generated in the active region 125 is directed up and out of the device 110. A mirror layer 135 near the base of the LED chip 110 reflects light emitted downward back to the surface of the LED chip 110 where it exits the device. The LED chip 110 may include electrical contacts 145 with the first and second LED regions 120,130 via contact regions 140 on opposing top and bottom surfaces 110a,110b of the chip 110, as shown in FIG. 1A. Alternatively, the contact regions 140 may be placed on either the top or bottom surface 110a,110b by etching a portion of the second LED region 130 for access to both layers 120,130 from one side of the chip 110a, as shown in FIG. 1B.

Figure 2:
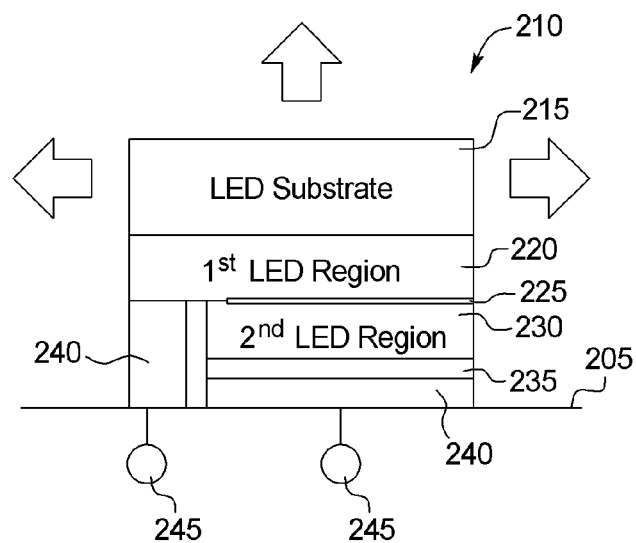
FIG. 2 is a cross-sectional schematic of a conventional LED chip mounted substrate side up in a flip chip configuration.
Figure 3A:
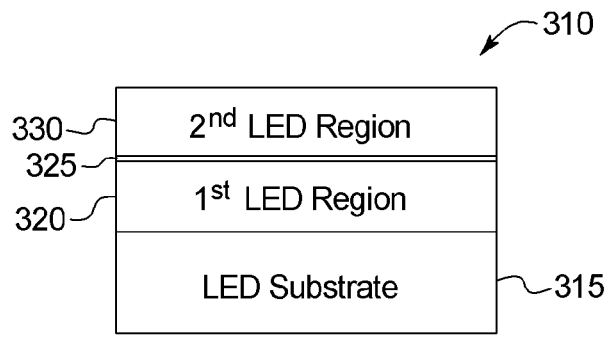
FIG. 3A is a cross-sectional schematic of an LED active layer sandwiched between doped epitaxial layers on a growth substrate.
Figure 3B:
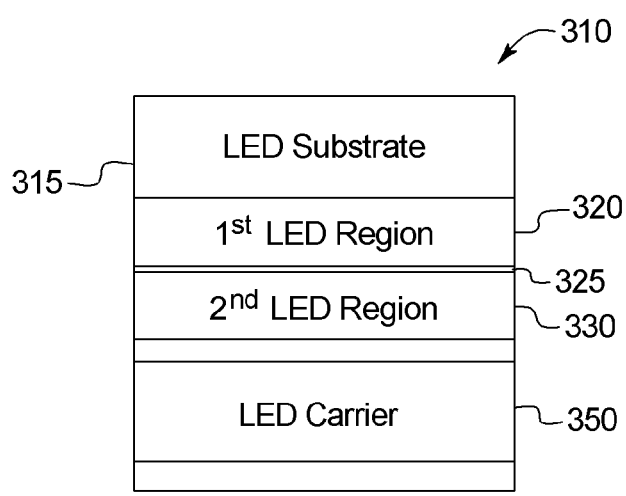
FIG. 3B shows the device of FIG. 3A flipped over and bonded to a carrier.
Figure 3C:
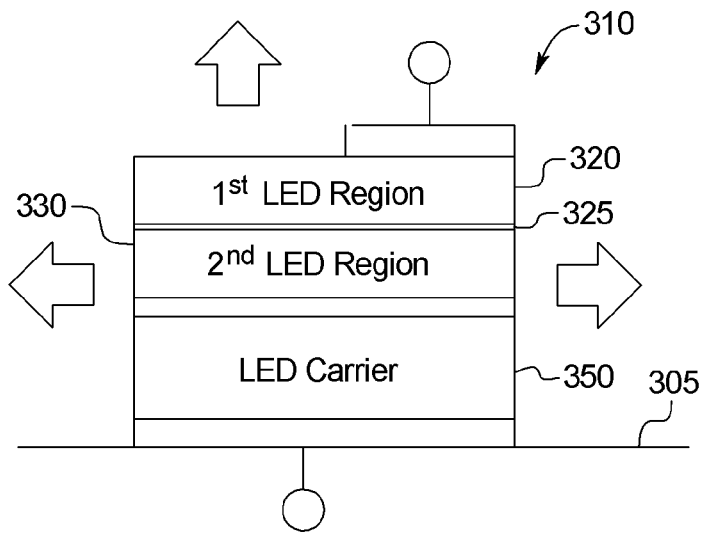
FIG. 3C shows the flip chip LED of FIG. 3B mounted on a mounting surface with the substrate removed and electrical connections added.

Referring now to FIG. 2, an LED chip 210 designed for flip chip mounting includes epitaxial layers (first and second LED regions) 220,230 grown on a transparent substrate 215, which is flipped over for mounting surface side up on a mounting surface 205. As with LED chips mounted substrate side down, flip chip LED structures 210 include an active light emitting region 225 sandwiched between p- and n-type epitaxial layers 220,230, as well as a mirror layer 235 near the base of the device 210 to redirect light emitted in the direction of the mounting surface 205. Electrical connections 245 are made with contact regions 240 in electrical contact with the p- and n-type layers 220,230. In some cases, as shown for example in FIGS. 3A-3C, an LED 310 including first and second LED regions 320,330 sandwiching an active light emitting region 325 may be flipped over and bonded to a carrier 350 prior to mounting on the mounting surface 305, and the transparent substrate 315 may remain after mounting, or it may be partially or fully removed (FIG. 3C).

Figure 4:
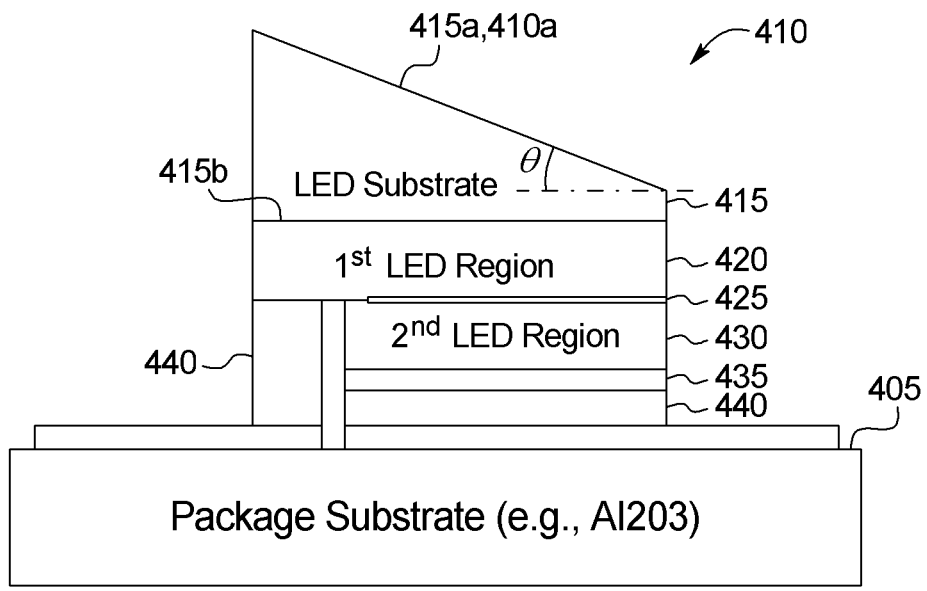
FIG. 4 shows a cross-sectional schematic of an LED chip including a layer having a surface nonparallel to the mounting surface.
Figure 5:
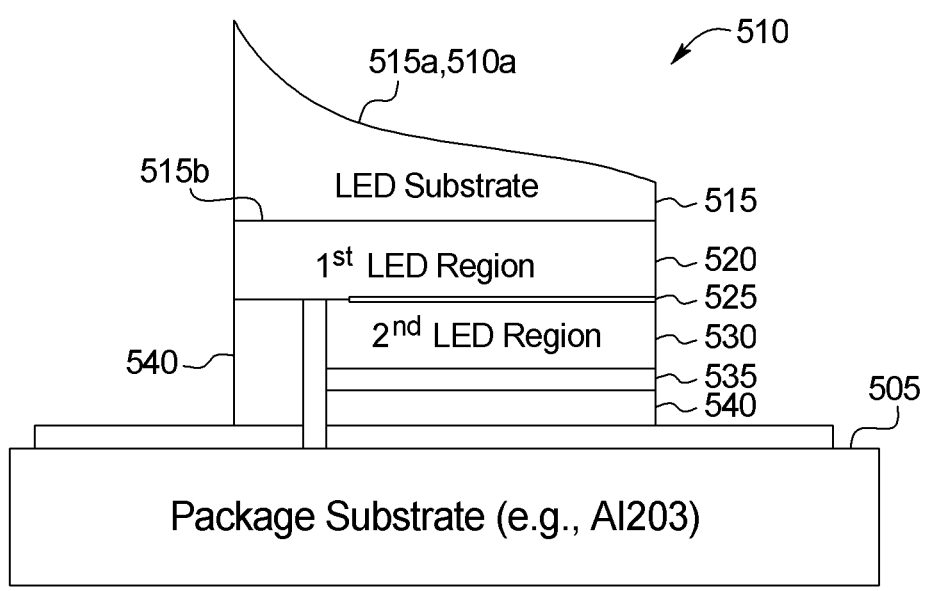
FIG. 5 shows a cross-sectional schematic of an LED chip including a layer having a curved surface.
Figure 6:
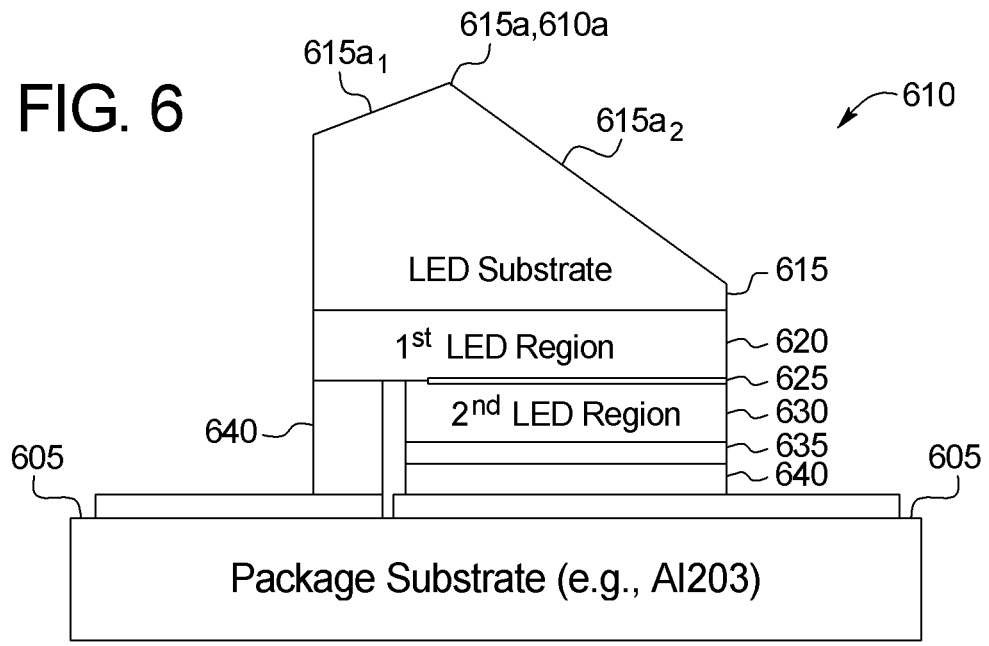
FIG. 6 shows a cross-sectional schematic of an LED chip including a faceted layer.

FIGS. 4-6 show three exemplary LED chips 410, 510, 610 that each include a layer 415, 515, 615 having a surface 415a, 515a, 615a configured to provide a peak emission directed away from a normal to the mounting surface 405, 505, 605. The LED chips have flip chip structures as described previously and are thus mounted substrate side up on a submount or other substrate that provides the mounting surface 405, 505, 605.

The LED chip 410 of FIG. 4 includes a plurality of layers 415, 420, 425, 430, 435 and 440, where the transparent substrate 415 has a surface 415a configured to provide a peak emission directed away from a normal to the mounting surface 405. This surface 415a may be referred to as a configured surface 415a, and the layer 415, which is the topmost layer of the LED chip 410, may be referred to as a configured layer 415.

In this embodiment, the top surface 415a of the transparent substrate 415 is aligned nonparallel to the mounting surface 405 and may be referred to as a facet. The bottom surface 415b of the transparent substrate 415 is substantially parallel to the mounting surface 405, and thus the top and bottom surfaces 415a, 415b are nonparallel to each other; as a result, the transparent substrate 415 has a nonuniform thickness. The top surface 415a is oriented at an angle θ with respect to the bottom surface 415b (and to the mounting surface 405), where the angle θ may lie between about 1° and 60°, for example, or between about 10° and 40°. Other layers (n-type layer or first LED region 420, active region 425, p-type layer or second LED region 430, mirror layer 435, contact layer 440) of the LED chip 410 are substantially parallel to the bottom surface 415b of the configured layer 415 and to the mounting surface 405.

The configured surface 415a of the transparent substrate 415 defines an external top surface 410a of the LED chip 410 from which light is emitted, and thus the transparent substrate 415 may function as an optical element to control the light emission. At least a portion of the light emitted by the active region 415 propagates through the transparent substrate 415 and out of the LED chip at an angle with respect to the normal due to the characteristics of the transparent substrate 415 (e.g., surface morphology and orientation, refractive index). In particular, the peak emission may be directed away from the normal to the mounting surface 405.

In the embodiment of FIG. 4, all of the surfaces of the layers of the LED chip are planar surfaces, where "planar" means substantially flat without intentional curvature. Such planar surfaces (in this and other embodiments) may be either smooth or rough with a measurable surface roughness. A smooth surface may allow predominantly refractive redirection of emitted light, whereas a rough surface may allow predominantly Lambertian re-emission of light.

It should also be noted that, in some examples, the orientation of a planar layer is described in reference to its top and bottom surfaces, which may be nonparallel to each other. For example, in the previous embodiment, the configured layer 415 was described as having a top surface 415a that is nonparallel to the mounting surface 405 and a bottom surface 415b that is substantially parallel to the mounting surface 405. If, however, a given planar layer is more generally described as having a particular orientation relative to another surface or layer without reference to the top and/or bottom surfaces of the given layer, it is understood that the top and bottom surfaces of the given planar layer are substantially parallel to each other.

In addition, it is understood that one or more of the layers of the LED chips shown in the figures may have a sublayer structure including two or more sublayers. For example, the active light emitting region shown schematically as a single layer in the figures may be a multiple quantum well active region that includes a plurality of nitride sublayers, as described for example in U.S. Pat. No. 6,958,497, which issued Oct. 25, 2005, or in U.S. Pat. No. 7,692,182, which issued Apr. 6, 2010, both of which are hereby incorporated by reference in their entirety. It is contemplated that a sublayer of any of the layers described herein may also or alternatively include a configured surface.

Referring now to FIG. 5, another embodiment of an LED chip 510 is shown. The LED chip 510 has a multilayered structure including a plurality of layers 515, 520, 525, 530, 535 and 540, where one of the layers 515 has a surface 515a configured to provide a peak emission directed away from a normal to the mounting surface 505. This surface 515a may be referred to as a configured surface 515a, and the layer 515 may be referred to as a configured layer 515.

As in the previous embodiment, the transparent substrate is the configured layer 515, which is the topmost layer of the LED chip 510 due to the flip chip mounting, and the top surface of the transparent substrate is the configured surface 515a. In contrast to the previous embodiment, however, the top surface 515a of the configured layer 515 is a curved surface, while the bottom surface 515b of the configured layer 515 is planar and is disposed substantially parallel to the package substrate 505, as in FIG. 4. Accordingly, the transparent substrate 515 has a nonuniform thickness. The curved surface 515a is engineered to have a curvature that is asymmetric with respect to the normal to the mounting surface. Other layers (n-type layer or first LED region 520, active region 525, p-type layer or second LED region 530, mirror layer 535, contact layer 540) of the LED chip 510 are also oriented substantially parallel to the bottom surface 515b of the configured layer 515 and to the package substrate 505.

The curved top surface 515a of the transparent substrate defines an external surface 510a of the LED chip 510 from which light is emitted, and the curvature may be selected to achieve a desired asymmetric light beam output profile. At least a portion of the light emitted from the active region 525 propagates through the transparent substrate 515 and out of the LED chip 510 at an angle with respect to the normal due to the characteristics of the transparent substrate 515 (e.g., surface morphology and orientation, refractive index). In particular, the peak emission may be directed away from the normal to the mounting surface 505.

FIG. 6 shows an LED chip 610 including a layer 615 having, in this embodiment, a faceted top surface 615a including two facets $615a_1, 615a_2$ configured to provide a peak emission directed away from the normal to the mounting surface 605. The faceted surface 615a may be referred to as configured surface 615a and the layer 615 may be referred to as a configured layer 615. As in the previous embodiments, the transparent substrate serves as the configured layer 615, which further includes a single bottom surface 615b that is planar and is disposed substantially parallel to the mounting surface 605. Other layers (n-type layer or first LED region 620, active region 625, p-type layer or second LED region 630, mirror layer 635, contact layer 640) of the LED chip 610 are also planar and oriented substantially parallel to the bottom surface 615b and to the mounting surface 605.

The two top facets $615a_1, 615a_2$ of the configured layer 615 of this embodiment are planar surfaces oriented nonparallel to each other, and the configured layer 615 has a nonuniform thickness. Since the configured layer 615 is the topmost layer of the LED chip, the facets $615a_1, 615a_2$ define the top surface 610a of the LED chip 610 from which light is emitted. The size and orientation of the facets $615a_1, 615a_2$ may be selected to create an asymmetric chip surface 610a, where the asymmetry is defined with respect to the normal to the mounting surface. For example, the facets may be nonuniform in size. They may also or alternatively be asymmetrically arranged with respect to the normal to the mounting surface. It is also envisioned that one or more of the facets may be curved instead of planar.

Light emitted from the active region 625 may be transmitted through the transparent substrate 615 and out of the top surface 610a of the LED chip 610 with a desired asymmetric emission profile due to the faceted surface topology and other characteristics (e.g., refractive index) of the configured layer 615. In particular, the peak emission may be directed away from the normal to the mounting surface 605.

Figure 7A:
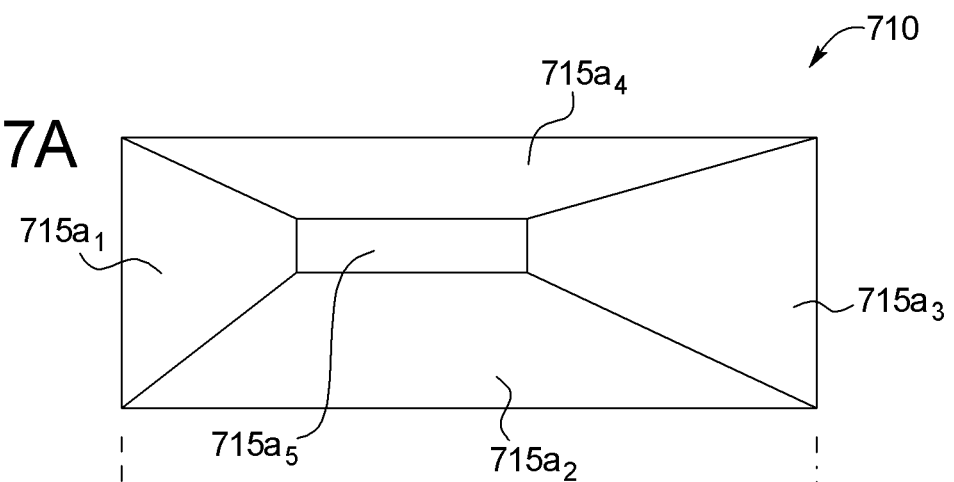
Figure 7B:
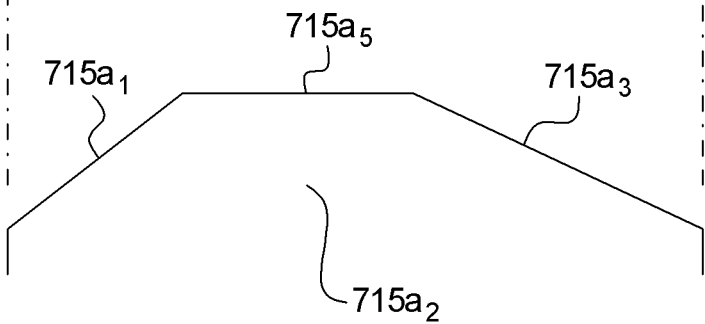
Figure 8:
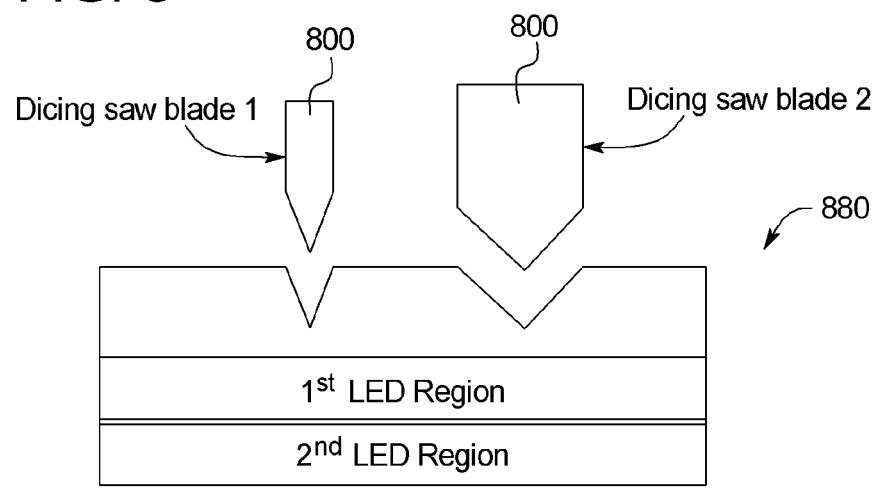
FIG. 8 depicts a method of making an exemplary LED chip having a faceted surface.
Figure 9A:
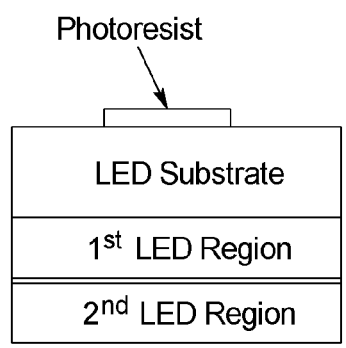
FIGS. 9A-9C depicts a method of making an exemplary LED chip including two asymmetric curved surfaces.
Figure 9B:
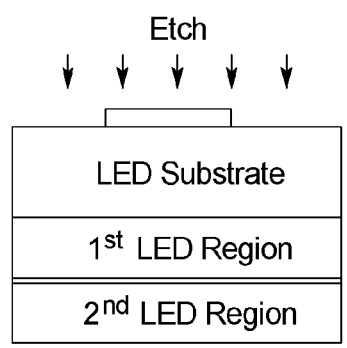
Figure 9C:
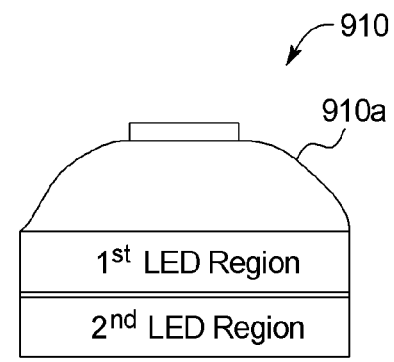

The cross-sectional schematic of FIG. 6 shows the presence of two facets 615a, 615a' on the surface of the LED chip. The configured layer could include any number of facets desired to control the emission profile, such as three facets or more, four facets or more, five facets or more, or six facets or more. FIGS. 7A and 7B, for example, provide top and side views of a portion of an exemplary rectangular LED chip 710 including a layer 715 having a bottom surface 715b oriented parallel to the surface of the mounting surface (not shown) and including five facets $715a_1, 715a_2, 715a_3, 715a_4, 715a_5$ configured to provide a peak emission directed away from a normal to the mounting surface. In general, the top and/or bottom surfaces of the configured layer may be faceted surfaces.

The above described asymmetric surface configurations may be fabricated using photolithographic processing or cutting methods known in the art. For example, one or more dicing saw blades 800 with a specified cutting surface geometry may be employed to carve out surface facets out of a wafer 880 prior to device singulation, as shown schematically in FIG. 8. In another example, photolithography and etching may be used to form an asymmetric curved surface 910a of an LED chip 910, as shown schematically in FIGS. 9A-9C.

The flip chip LEDs of the previous embodiments included a transparent substrate as the top layer that served as the configured layer for each embodiment. In other embodiments, however, another layer of the LED chip, such as the first LED region (e.g., n-type layer) or second LED region (e.g., p-type layer), may serve as the configured layer that includes one or more surfaces configured to provide a peak emission directed away from the normal to the mounting surface.

Figure 10A:
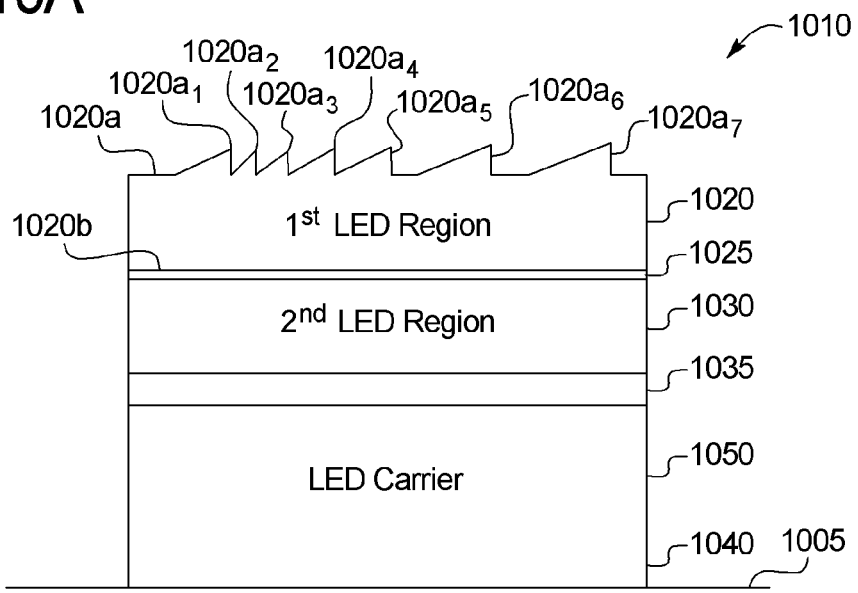
FIG. 10A is a cross-sectional schematic of an exemplary LED chip including angular protrusions on the top surface.
Figure 10B:
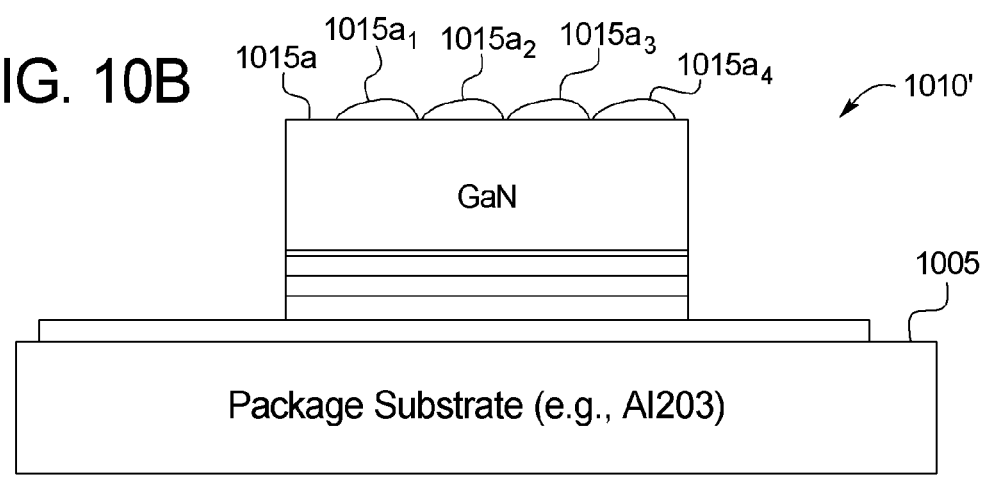
FIG. 10B is a cross-sectional schematic of an exemplary LED chip including curved protrusions on the top surface.

The LED chip 1010 of FIG. 10A, for example, does not have a transparent substrate overlying the first and second LED regions (n- and p-type layers) 1020, 1030 and the active layer 1025 as in the previous embodiments; instead, the substrate was removed after the device 1010 was flipped over and mounted. As a result, the topmost layer of the LED chip 1010, which is also the configured layer, is the first LED region (e.g., the n-type layer) 1020 of the LED chip 1010.

In this embodiment, the first LED region 1020 includes a top surface 1020a configured to provide a peak emission directed away from a normal to the mounting surface 1005. The top surface is a planar surface 1020a that includes a plurality of surface features $1020a_1, 1020a_2 \ldots 1020a_n$ (angular protrusions, in this embodiment) that act as microlenses to guide the light emitted from the active region; the size, shape, and arrangement of the surface features are engineered to produce an asymmetric emission profile. The first LED region 1020 further includes a planar bottom surface 1020b disposed substantially parallel to the mounting surface 1005, and thus the configured layer 1020 has a nonuniform thickness. Other layers (active region 1025, second LED region or p-type layer 1030, mirror layer 1035, contact layer 1040) of the LED chip 1010 are also planar and oriented substantially parallel to the bottom surface 1015b and to the mounting surface 1005.

The angular protrusions $1020a_1, 1020a_2 \ldots 1020a_n$ shown in FIG. 10A could be replaced by surface features of other angular or curved morphologies, including angular indentations, curved protrusions, and/or curved indentations, depending on the desired emission. Advantageously, one or more of the surface features has an asymmetric shape with respect to the normal to the mounting surface, as shown in FIG. 10A. In general, the surface features are microscale in at least one dimension. For example, they may be about 500 microns or less in height or depth (vertical dimension) and about 1 mm or less in one or both lateral dimensions (length and/or width). The height/depth of the surface features may also be about 100 microns or less, or about 10 microns or less. The lateral dimensions may depend on the size of the LED chip, where larger LED chips may include larger surface features. For example, a 2 mm square LED chip may have surface features with one or both lateral dimensions greater than 1 mm. On the other hand, the surface features may have a length and/or width that is about 500 microns or less, or about 100 microns or less. The surface features may be of different sizes or they may be substantially the same in size.

Depending on the desired light output, it may be beneficial for the surface features may be nonuniformly spaced apart from each other in a random or disordered array, as shown in FIG. 10A. Alternatively, the desired emission profile may be achieved with surface features having an asymmetric shape that are arranged in an ordered array having a periodicity in one or two dimensions, as illustrated according to one embodiment in FIG. 10B. The exemplary LED chip 1010' of FIG. 10B includes asymmetric curved protrusions $1015_{a1}$, $1015_{a2}$, $1015_{a3}$, $1015_{a4}$ positioned in an ordered array with no space between adjacent protrusions. In this example, the protrusions $1015_{a1}$, $1015_{a2}$, $1015_{a3}$, $1015_{a4}$ are part of the top surface 1015a of the transparent substrate 1015, which was not removed after mounting the LED chip 1010'. It is also envisioned that an array could include a combination of two or more types of surface features having different morphologies (e.g., angular protrusions and curved protrusions). An example of an array of surface features with known optical properties is a Fresnel lens. The above-described surface features could be formed by photolithographic processing methods known in the art.

Figure 10C:
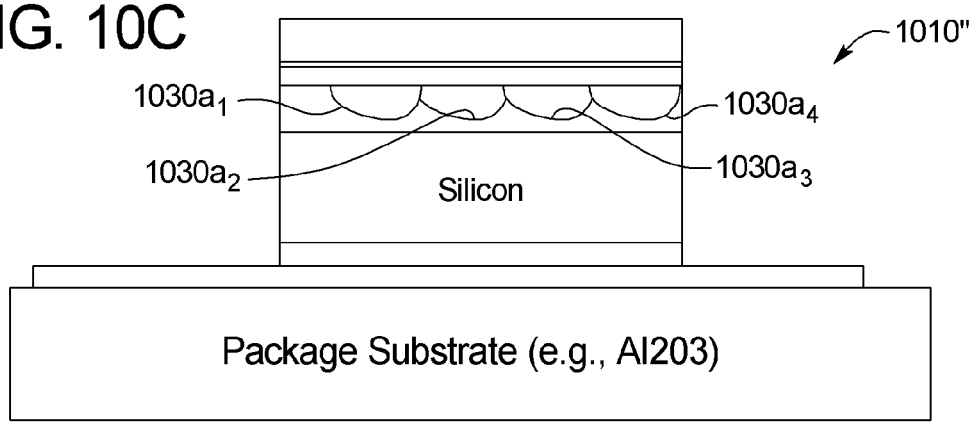
FIG. 10C is a cross-sectional schematic of an exemplary LED chip including interfacial features between adjacent layers.

In all of the previously described embodiments, the surface configured to provide the desired peak emission was an external surface of the LED chip. It is also possible to control the emission profile using one or more internal surfaces having any of the geometries described above for the configured surfaces of FIGS. 4-10B. Such internal surfaces define interfaces between adjacent layers of the LED chip. Referring to FIG. 10C, for example, the external surface features shown in FIG. 10B could alternatively be internal features $1030a_1$, $1030a_2$, $1030a_3$, $1030a_4$ of the LED chip 1010'' that define an interface between the second LED region 1030 and the mirror layer 1035.

An example of how such interfaces may be fabricated is described in reference to FIGS. 11A to 11D. In this example, a plurality of angular protrusions $1130a_1, 1130a_2 \ldots 1130a_n$ are formed on the second LED region (e.g., a p-type layer) 1130 of an LED chip 1110, and an optically reflective material is deposited over the surface features to form a mirror layer 1135. The chip 1110 is then flipped over and mounted onto a carrier 1150, as shown in FIG. 11C. The substrate 1115 is then removed and electrical contacts 1145 are made with the chip 1110. The resulting LED chip 1110 includes a configured internal surface 1130a—or configured interface 1130a—that may alter the emission profile of the device 1110.

In this example, the configured internal surface 1130a, which includes a plurality of angular surface features, defines an interface between the second LED region 1130 and the mirror layer 1135, both of which lie below the active region 1125. Consequently, light emitted downward from the active layer 1125 may interact with the interfacial features $1130a_1$, $1130a_2 \ldots 1130a_n$ at the mirror surface 1135 and be directed up and out of the chip 1110 in a direction away from the normal to the mounting surface 1105, while light emitted directly upward from the active layer 1125 is not affected by the configured internal surface 1130a. The interfacial features $1130a_1, 1130a_2 \ldots 1130a_n$ may have any of the characteristics described above for the surface features of the LED chip 1110 of FIG. 10a. In addition, as indicated above, the configured internal surface 1130a may have the geometry of any of the configured external surfaces shown in FIGS. 4 through 9 and/or described above.

For example, an LED component including an LED chip having a plurality of internal surfaces configured to produce an asymmetric light output profile is shown schematically in FIG. 12. In this example, it is the nonparallel orientation of a number of surfaces of with respect to the mounting surface that controls the light emission. The LED chip 1210 of this embodiment is mounted substrate side down on a mounting surface 1205, and the LED chip 1210 includes a plurality of layers 1215, 1220, 1225, 1230, 1235 and 1240. Several of the internal layers, including the active layer 1225 and the transparent growth substrate 1215, include surfaces 1215a,1225a having a nonparallel orientation with respect to the mounting surface. These internal surfaces 1215a,1225a may be referred to as configured surfaces, and the layers 1215,1225 may be referred to as configured layers, as in previous embodiments.

Referring again to FIG. 12, the active layer 1225 is oriented nonparallel to the mounting surface 1205 and the top surface 1215a of the transparent substrate 1215 is also nonparallel to the mounting surface 1205. In contrast, the bottom surface 1215b of the transparent substrate 1215 is substantially parallel to the mounting surface 1205, giving the transparent substrate a wedge shape. The mirror layer 1235 underlies the transparent substrate 1215 and is also disposed substantially parallel to the mounting surface 1205. Accordingly, the active layer 1225 and the mirror layer 1235 are nonparallel to each other. Of the remaining layers, the first and second LED regions (n- and p-type layers) 1220,1230 are parallel to the active layer 1225, and the contact layer 1240 is parallel to the mirror layer 1235.

The active layer 1225 and the top surface 1215a of the transparent substrate 1215 are oriented at an angle θ with respect to the bottom surface 1215b of the substrate 1215 and the mirror layer 1235, where the angle θ may lie between about 1° and 60°, for example, or between about 10° and 40°. As a consequence, light emitted upward from the active region 1225 passes out of the device 1210 with a peak emission directed away from the normal to the mounting surface 1205, and light emitted downward propagates through the wedge-shaped transparent substrate 1215, is reflected by the mirror layer 1235 and is transmitted back through the substrate 1215 and out of the device 1210 in a direction that depends on the angle θ and the refractive index of the transparent substrate 1215. In addition, depending on the distance between the active layer 1225 and the mirror 1235, the angle θ may affect apodization and allow further control of the output beam profile.

Figure 13:
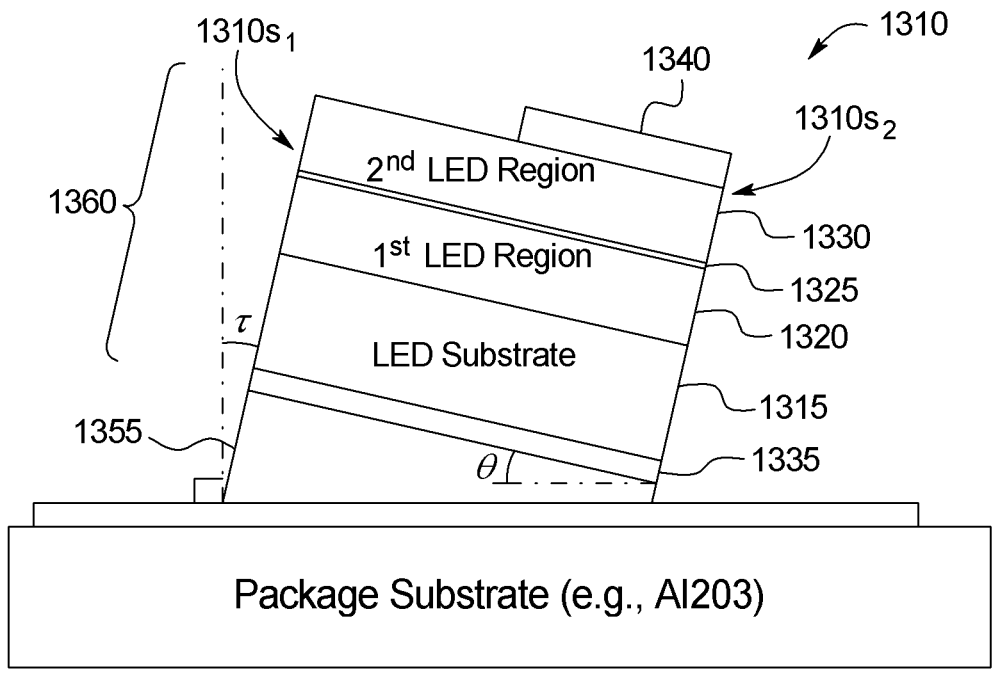
FIGS. 13 to 15 are cross-sectional schematics of an exemplary LED chip including a tilt with respect to a normal to the mounting surface.
Figure 14:
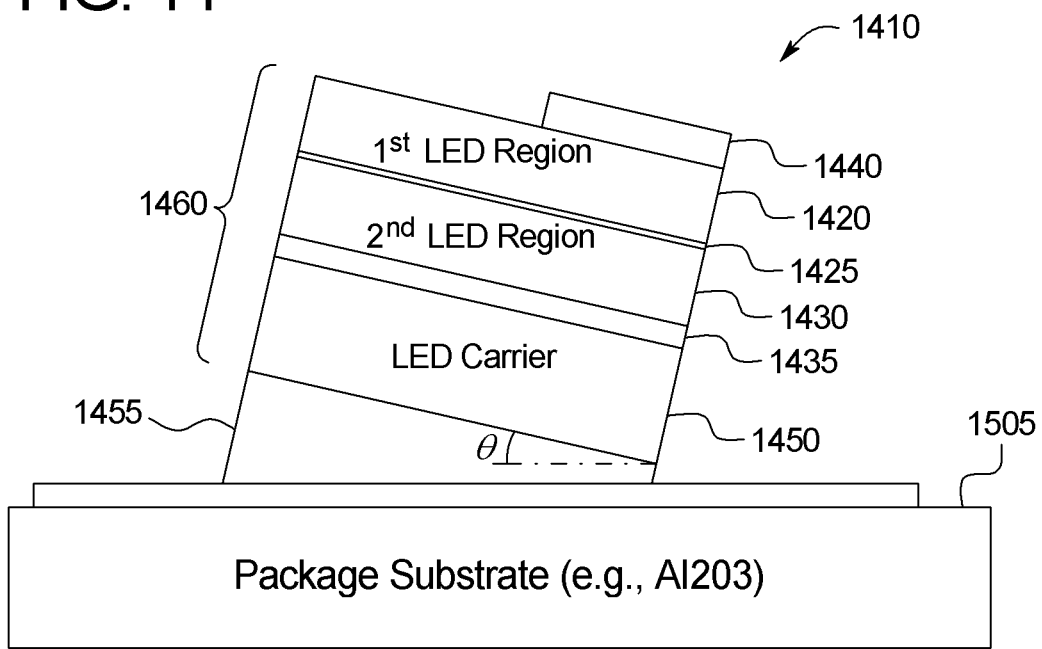
Figure 15:
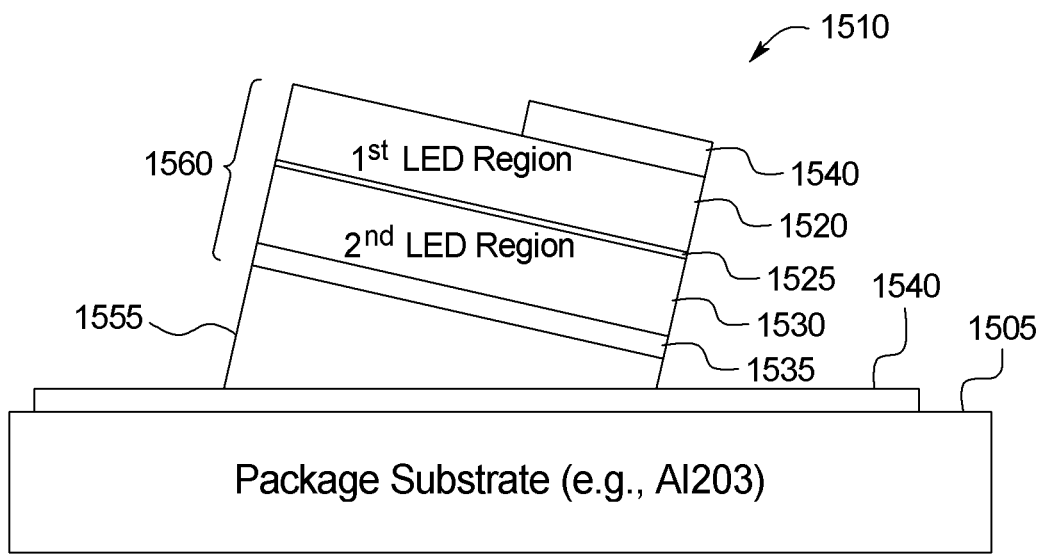
Figure 16:
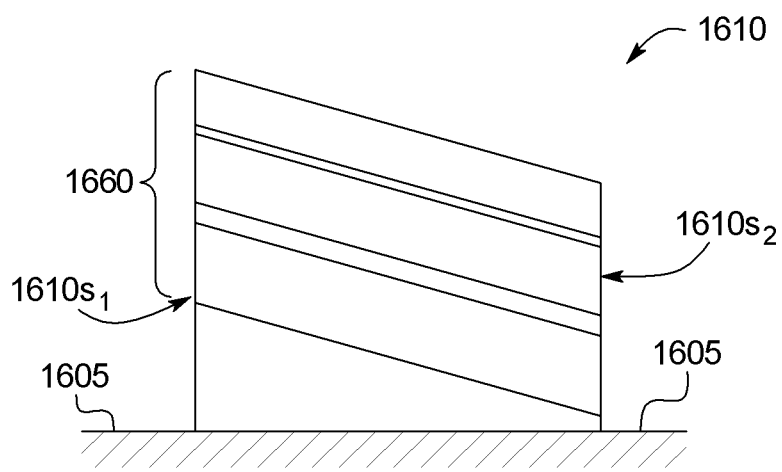
FIG. 16 is a cross-sectional schematic of an exemplary LED chip having layers nonparallel to the mounting surface.

Further examples of LED chips having internal configured surfaces are shown in FIGS. 13 to 15. FIG. 13 shows a LED chip 1310 mounted substrate side down, while FIGS. 14 and 15 show LED chips 1410,1510 having a flip chip configuration, where, after mounting the LED chip substrate side up on a carrier, the substrate is removed. In each of these examples, a plurality of layers 1360,1460,1560 (the first LED layer 1320,1420,1520, second LED layer 1330,1430,1530, active layer 1325,1425,1525, transparent substrate or carrier 1315, 1450 (FIGS. 13 and 14 only), and mirror layer 1335,1435, 1535) are oriented nonparallel to the mounting surface 1305, 1405,1505 and thereby configured to emit light in a direction away from the normal to the mounting surface 1305,1405, 1505. The layers 1360,1460,1560 are also substantially parallel to each other. Particularly important is the orientation of the active layer 1325,1425,1525 and the underlying mirror layer 1335,1435,1535 with respect to the mounting surface 1305,1405,1505 and to each other.

The LED chips of FIGS. 13 to 15 further comprise a bottom layer 1355,1455,1555 of a nonuniform thickness between the plurality of layers 1360,1460,1560 and the mounting surface

1305,1405,1505, where the bottom layer 1355,1455,1555 has a top surface 1355a,1455a,1555a parallel to the plurality of layers and a bottom surface 1355b,1455b,1555b parallel to the mounting surface 1305,1405,1505. The plurality of layers 1360,1460,1560 and the top surface 1355a,1455a,1555a of the bottom layer 1355,1455,1555 are oriented at an angle θ with respect to the mounting surface 1305,1405,1505. The angle θ may lie between about 1° and 60°, for example, or between about 10° and 40°. The bottom layer 1355,1455, which is wedge-shaped, may be etched or cut from a conductive material that serves as a contact layer (FIGS. 13 and 14). Alternatively, the wedge-shaped bottom layer 1555 may be etched or cut from a carrier to which the LED chip 1510 is bonded (FIG. 15).

In the above examples, the LED chip includes side surfaces 1310$s_1$,1310$s_2$ that are substantially perpendicular to the plane of the layers 1360, and thus the LED chip 1310 itself comprises a tilt τ with respect to the normal to the mounting surface 1305, as illustrated in FIG. 13. Alternatively, the side surfaces 1610$s_1$,1610$s_2$ of the LED chip 1610 may be aligned with the normal to the mounting surface 1605 such that the LED chip 1610 itself is not tilted, as shown for example in FIG. 16; however, the plurality of layers 1660 may remain nonparallel with the mounting surface 1605 as described above to direct the peak emission away from the normal to the mounting surface 1605.

In the embodiments described above, the LED chip geometry is altered to achieve asymmetric beam output profiles. Since LED chips generally emit in a single narrow wavelength band (e.g., predominantly blue, green, red, etc. light), the LED chips of the previous embodiments may be particularly useful where a specific color of light is desired, or in combination with LEDs of different wavelength emissions to produce either predominantly white light or a variety of colors depending on the particular electrical bias applied to the different LEDs. For example, red, green and blue LEDs may be employed in a display or monitor to provide a range of output colors.

Figure 17:
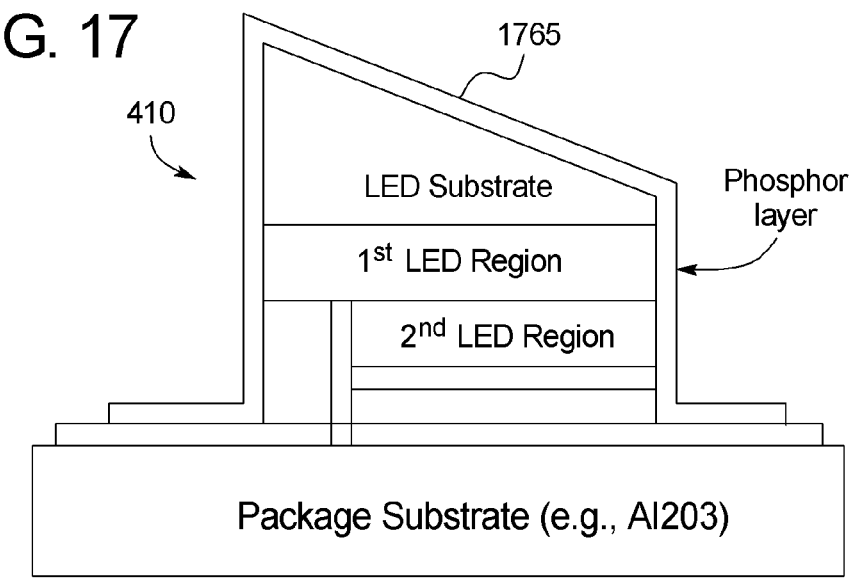
FIGS. 17 and 18 show the addition of a phosphor layer to the embodiments of FIGS. 4 and 15.
Figure 18:
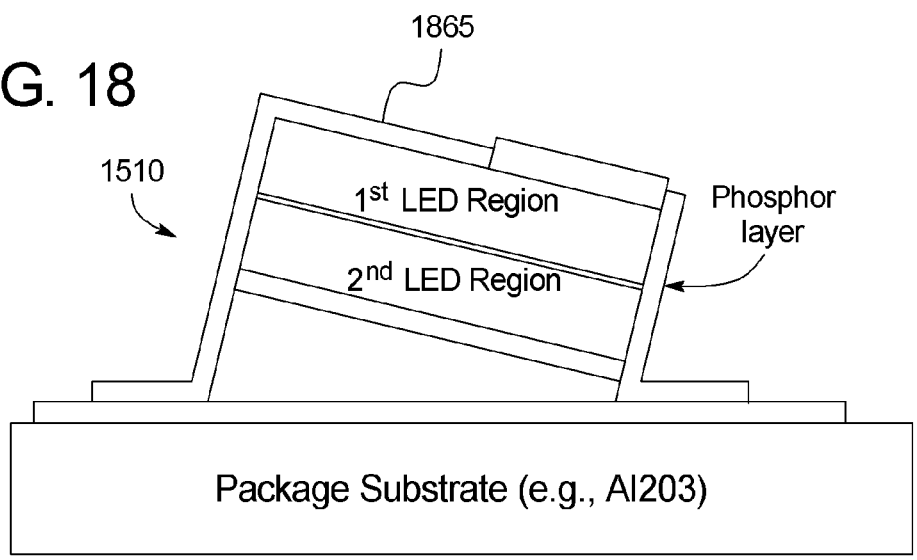

Another approach for producing white light from one or more LEDs of the same output wavelength band is to apply a downconversion material, such as a phosphor, to the vicinity of the chip. For example, a blue-emitting LED chip coated with a Ce:YAG phosphor could produce both blue and downconverted yellow light in the appropriate proportions to result in white-appearing light when viewed with the human eye. Accordingly, a phosphor layer may be applied to any of the above-described LED chips, resulting in white light having a peak emission directed away from a normal to the mounting surface. FIGS. 17 and 18 show the LED chips 410,1510 of FIGS. 4 and 15 modified to include an overlying phosphor layer 1765,1865. The phosphor layer 1765,1865 may be applied by electrophoretic or spraying approaches known in the art using phosphor particles dispersed in a liquid matrix, such as silicone, which is cured after the phosphor layer 1765,1865 is deposited.

Figure 19A:
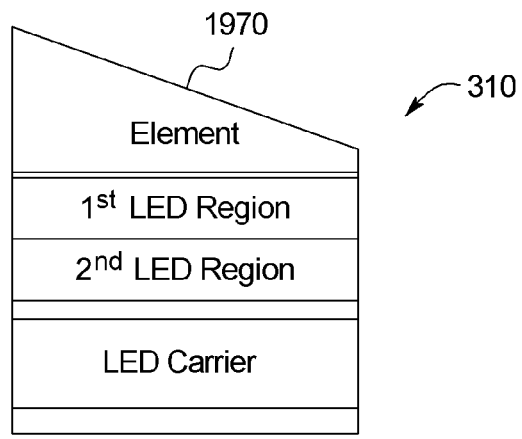
FIG. 19A shows the addition of a secondary element to the LED chip of FIG. 3.
Figure 19B:
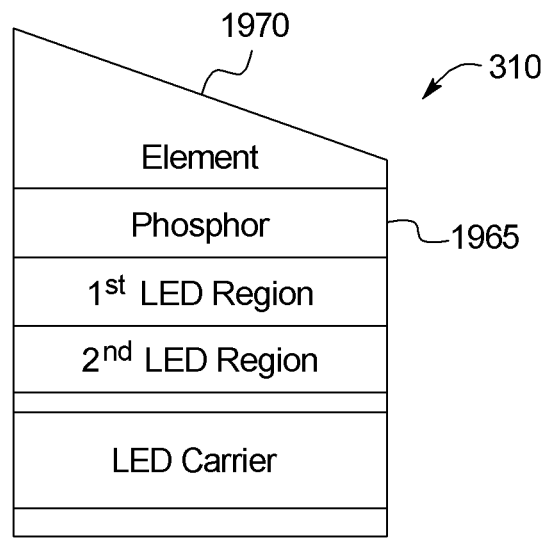
FIG. 19B shows the addition of a phosphor layer and a secondary element to the LED chip of FIG. 3.

In an alternative embodiment, the desired asymmetric emission profile may be attained using a standard LED chip geometry, such as one of the geometries shown in FIGS. 1 to 3C, in conjunction with a secondary optical element having one or more surfaces configured to provide a peak emission directed away from the normal to the mounting surface. The secondary optical element 1970 may be applied directly to the top surface of the LED chip 310, as shown in FIG. 19A, or a phosphor layer 1965 may be deposited on the top surface of the LED chip 310 prior to applying the secondary element 1970, as shown in FIG. 19B. This approach may be particularly suited to the chip-on-carrier geometry (where the substrate has been removed and the first LED region (e.g., n-type layer) serves as the top layer of the LED chip) since direct modification of the thin n-type region may be difficult. The secondary optical element 1970 may be formed of a substantially transparent material, such as alumina, silicon carbide, or glass.

It is also envisioned that the secondary optical element as described above may be applied to an LED chip as set forth in any of the preceding embodiments, where the LED chip itself includes at least one layer having one or more surfaces configured to provide a peak emission directed away from a normal to the mounting surface.

Figure 20:
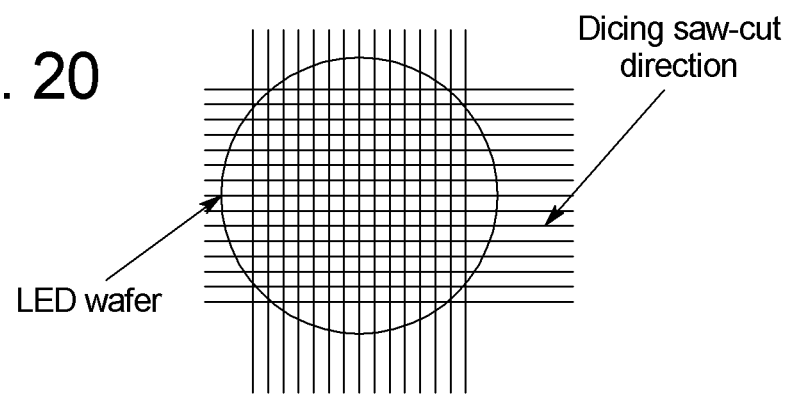
FIG. 20 depicts a method of making a plurality of LED chips having a square shaped perimeter.
Figure 21:
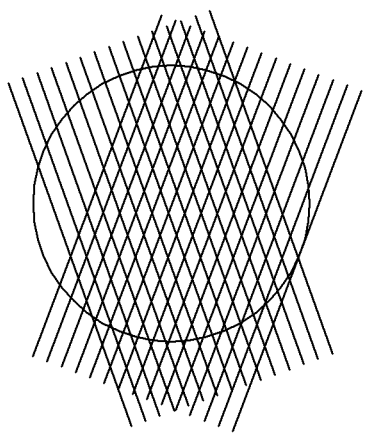
FIG. 21 depicts a method of making a plurality of LED chips having a diamond shaped perimeter.

The LED chips typically have a square or rectangular shape when view from above. More particularly, the four side surfaces of a given LED chip may be oriented at a right angle with respect to an adjacent side surface, thereby defining a square or rectangular perimeter of the chip. In some embodiments, more desirable results may be obtained with rectangular than with square chips due to their lower symmetry, as shown for example in FIG. 7A, which was described previously. The top-view shape or perimeter is determined by the singulation procedure, which may involve saw-cutting (dicing) the wafer in two perpendicular directions, as shown schematically in FIG. 20 for square LED chips. It is also envisioned that alternative chip shapes may be obtained using known dicing or etching procedures, although useable wafer area may be lost in the singulation process. For example, referring to FIG. 21, the wafer may be diced to form diamond-shaped chips by dicing the wafer in two non-perpendicular directions. In other words, each side surface of the four-sided LED chip is oriented an angle of greater than or less than 90° with respect to an adjacent side surface, such that the perimeter of the chip has a diamond shape. The combination of asymmetric facet design and a lower symmetry chip shape may provide additional flexibility in tailoring the optical output.

Any of the features of the LED chips described separately above may be combined within a single chip to achieve the desired asymmetric emission profile. For example, a surface of a layer oriented nonparallel to the mounting surface may further include surface features as described above to act as microlenses, or a faceted surface including a number of facets may further be positioned nonparallel to the mounting surface. By altering the structure of conventional LED chips as described in the present disclosure to include asymmetric surface characteristics and/or orientations, the LED chip may have a peak emission directed away from the normal to the mounting surface as desired. For example, depending on the intended application, an appropriate range for the shift in the peak emission from the normal may be between about 5 degrees and about 30 degrees, and the shift may also lie between about 10 degrees and about 20 degrees. Alternatively, other ranges of shift angles can be used.

Fabrication of LED chips is generally known, and is only briefly described here. LEDs can be fabricated using known processes, with a suitable process being metal organic chemical vapor deposition (MOCVD). The layers of the LEDs generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

Additional layers and elements may also be included in the LEDs, including but not limited to buffer, nucleation, contact and current spreading layers, as well as light extraction layers and elements. The active region can comprise single quantum well (SQW), multiple quantum well (MQW), double heterostructure or superlattice structures. The active region and doped layers (n- and p-type layers) may be fabricated from different material systems, with preferred material systems being Group-III nitride based material systems. Group-III nitrides refer to those semiconductor compounds formed between nitrogen and the elements in the Group III of the periodic table, usually aluminum (Ai), gallium (Ga), and indium (in). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof as well as conducting oxides and transparent conducting oxides. The current spreading structure can comprise conductive fingers arranged in a grid on the LEDs with the fingers spaced to enhance current spreading from the pads into the top surface of the LEDs. In operation, an electrical signal is applied to the pads through a wire bond, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light and emitting a different wavelength of light such that the LED emits a combination of light from the LED and the phosphor. In one embodiment according to the present invention the white emitting LEDs have an LED that emits light in the blue wavelength spectrum and the phosphor absorbs some of the blue light and re-emits yellow. The LEDs emit a white light combination of blue and yellow light. In other embodiments, the LED chips emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

LEDs that emit red light can comprise LED structures and materials that permit emission of red light directly from the active region. Alternatively, the red emitting LEDs can comprise LEDs covered by a phosphor that absorbs the LED light and emits a red light. Some phosphors appropriate for these structures may include: $Lu_2O_3$:$Eu^{3+}$; $(Sr_{2-x}La_x)(Ce_{1-x}Eu_x)O_4$; $Sr_{2-x}Eu_xCeO_4$; $SrTiO_3$:$Pr^{3+}$, $Ga^{3+}$; $CaAlSiN_3$:$Eu^{2+}$; and $Sr_2Si_5N_8$:$Eu^{2+}$.

LEDs may be coated with a phosphor using many different methods, with one suitable method being described U.S. patent application Ser. Nos. 11/656,759 (U.S. Patent Application Publication 2008/0173884) and 11/899,790 (U.S. Patent Application Publication 2008/0179611), both entitled "Wafer Level Phosphor Coating Method and Devices Fabricated Utilizing Method," and both of which are incorporated herein by reference. Alternatively, the LEDs can be coated using other methods, such as electrophoretic deposition (EPD), with a suitable EPD method described in U.S. patent application Ser. No. 11/473,089 (U.S. Patent Application Publication 2007/0158668) entitled "Close Loop Electrophoretic Deposition of Semiconductor Devices," which is also incorporated herein by reference. It is understood that LED components according to the present disclosure can also have multiple LEDs of different colors, one or more of which may be white emitting.

The mounting surfaces may be surfaces of submounts or other package substrates that are formed of any of a number of different materials, with a preferred material being an electrically insulating material, such as a dielectric element, with the submount being between the LED array and the component backside. The submount may include a ceramic such as alumina, aluminum nitride, silicon carbide, or a polymeric material such as polymide and polyester, etc. In one embodiment, the dielectric material has a high thermal conductivity such as with aluminum nitride and silicon carbide. In other embodiments, the submounts can include highly reflective material, such as reflective ceramic or metal layers like silver, to enhance light extraction from the component. In other embodiments the submount can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used, such as standard FR-4 PCB, metal core PCB, or any other type of printed circuit board.

In summary, the peak emission of the LED chips described above may be shifted away from the normal to an underlying mounting surface for applications where an asymmetric, non-uniform, broadened, and/or multi-lobed intensity profile may be advantageous. For example, such LED chips may be beneficial for displays that are mounted above eye level of the likely viewer. The technology may permit an LED display to be mounted flat in an elevated location, such as a stadium, eliminating the cost and complications for mounting the display at an angle while still allowing for more emitted light to be directed along the viewer's line of sight. The technology may also have benefits for other display applications, including street lights, automotive lights, and architectural lighting.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A light emitting diode (LED) for achieving an asymmetric light output therefrom, the LED comprising:
   a multilayered structure comprising epitaxial layers and a transparent substrate, the epitaxial layers comprising a p-n junction, where the transparent substrate comprises a wedge shape consisting of:
   an external top surface of the LED from which light is emitted, a bottom surface, and four side surfaces separating the external top surface from the bottom surface, the external top surface not being in contact with the bottom surface, the external surface being a planar surface oriented nonparallel to the p-n junction so as to provide a peak emission in a direction away from a normal to a mounting surface, the external top surface and the bottom surface being nonparallel to each other, and the side surfaces being oriented substantially perpendicular to the p-n junction,
   wherein the transparent substrate does not comprise a secondary optical element attached thereto,
   wherein the multilayered structure comprises a phosphor layer thereon, the phosphor layer conformally covering the external top surface, and
   wherein the LED comprises an asymmetric light emission profile.

2. The LED of claim 1, wherein the transparent substrate comprises a nonuniform thickness.

3. The LED of claim 1, wherein the transparent substrate comprises a substantially transparent material.

4. The LED of claim 1, wherein the multilayered structure further comprises a mirror layer comprising an optically reflective material, and
   wherein the epitaxial layers comprising the p-n junction and the mirror layer are substantially parallel to each other.

5. The LED of claim 1, wherein the LED comprises four of the side surfaces, and each of the side surfaces is oriented at a right angle with respect to an adjacent side surface, the side surfaces defining a square or rectangular perimeter of the LED.

6. The LED of claim 1, wherein, when mounted on the mounting surface, the transparent substrate is disposed above the epitaxial layers, the LED having a flip chip orientation.

7. The LED of claim 1, wherein the four side surfaces comprise different heights.

8. A light emitting diode (LED) component for achieving an asymmetric light output therefrom, the LED component comprising:
   a mounting surface; and
   a multilayered structure comprising epitaxial layers mounted on the mounting surface, the epitaxial layers comprising a p-n junction, wherein a single continuous configured layer of the multilayered structure comprises a wedge shape consisting of:
   an external top surface of the LED from which light is emitted, a bottom surface, and four side surfaces separating the external top surface from the bottom surface, the external top surface not being on contact with the bottom surface, the external top surface being a planar surface oriented nonparallel to the mounting surface so as to provide a peak emission in a direction away from a normal to the mounting surface, the external top surface and the bottom surface being nonparallel to each other, and the side surfaces being oriented substantially perpendicular to the p-n junction, wherein the single continuous configured layer comprises a nonuniform thickness,
   wherein the single continuous configured layer does not comprise a secondary optical element attached thereto,
   wherein the multilayered structure comprises a phosphor layer thereon, the phosphor layer conformally covering the external top surface, and
   wherein the LED comprises an asymmetric light emission profile.

9. The LED component of claim 8, wherein the single continuous configured layer comprises a transparent substrate.

10. The LED component of claim 8, wherein the multilayered structure has a flip chip orientation on the mounting surface.

11. The LED component of claim 8, wherein the external top surface is oriented at angle θ of between about 1° and 60° with respect to the bottom surface.

12. The LED of claim 1, wherein the peak emission is shifted between about 5 degrees and about 30 degrees from the normal to the mounting surface.

13. The LED of claim 8, wherein the peak emission is shifted between about 5 degrees and about 30 degrees from the normal to the mounting surface.

14. The LED of claim 8, wherein the four side surfaces comprise different heights.

15. A light emitting diode (LED) for achieving an asymmetric light output therefrom, the LED comprising:
   a multilayered structure comprising epitaxial layers and a transparent substrate, the epitaxial layers comprising a p-n junction, where the transparent substrate comprises a wedge shape consisting of:
   an external top surface of the LED from which light is emitted, a bottom surface, and four side surfaces separating the external top surface from the bottom surface, the external top surface not being in contact with the bottom surface, the external top surface being a planar surface oriented nonparallel to the p-n junction so as to provide a peak emission in a direction away from a normal to a mounting surface, the external top surface and the bottom surface being nonparallel to each other, and the side surfaces being oriented substantially perpendicular to the p-n junction,
   wherein the transparent substrate does not comprise a secondary optical element attached thereto, and
   wherein the LED comprises an asymmetric light emission profile.

16. The LED of claim 15, wherein the four side surfaces comprise different heights.

17. A light emitting diode (LED) component for achieving an asymmetric light output therefrom, the LED component comprising:
   a mounting surface; and
   a multilayered structure comprising epitaxial layers mounted on the mounting surface, the epitaxial layers comprising a p-n junction, wherein a single continuous configured layer of the multilayered structure comprises a wedge shape consisting of:
   an external top surface of the LED from which light is emitted, a bottom surface, and four side surfaces separating the external top surface from the bottom surface, the external top surface not being in contact with the bottom surface, the external top surface being a planar surface oriented nonparallel to the mounting surface so as to provide a peak emission in a direction away from a normal to the mounting surface, the external top surface and the bottom surface being nonparallel to each other, and the side surfaces being oriented substantially perpendicular to the p-n junction, wherein the single continuous configured layer comprises a nonuniform thickness, wherein the single continuous configured layer does not comprise a secondary optical element attached thereto, and wherein the LED comprises an asymmetric light emission profile.

* * * * *

UNITED STATES PATENT AND TRADEMARK OFFICE
CERTIFICATE OF CORRECTION

| | | |
|---|---|---|
| PATENT NO. | : 9,263,636 B2 | Page 1 of 1 |
| APPLICATION NO. | : 13/100786 | |
| DATED | : February 16, 2016 | |
| INVENTOR(S) | : Eric J. Tarsa et al. | |

It is certified that error appears in the above-identified patent and that said Letters Patent is hereby corrected as shown below:

<u>In the Claims</u>

In column 15, claim 1, line 15, after "surface, the external" insert --top--.

In column 15, claim 8, line 61, after "surface not being" replace "on" with --in--.

Signed and Sealed this
Twenty-third Day of August, 2016

Michelle K. Lee
*Director of the United States Patent and Trademark Office*